(12) United States Patent
Jeong et al.

(10) Patent No.: US 11,880,601 B2
(45) Date of Patent: Jan. 23, 2024

(54) DATA STORAGE DEVICE FOR PERFORMING READ OPERATION AND OPERATING METHOD THEREOF

(71) Applicant: SK hynix Inc., Icheon-si (KR)

(72) Inventors: Jae Hyeong Jeong, Icheon-si (KR); Dae Sung Kim, Icheon-si (KR); Sung Ho Ahn, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 161 days.

(21) Appl. No.: 17/513,305

(22) Filed: Oct. 28, 2021

(65) Prior Publication Data

US 2022/0374171 A1    Nov. 24, 2022

(30) Foreign Application Priority Data

May 20, 2021    (KR) .................. 10-2021-0064881

(51) Int. Cl.
*G06F 3/06*    (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0679; G06F 3/061; G06F 3/0611
See application file for complete search history.

(56) References Cited

U.S. PATENT DOCUMENTS

| | | | | |
|---|---|---|---|---|
| RE48,431 E | * | 2/2021 | Kim | G11C 16/08 |
| 2021/0389878 A1 | * | 12/2021 | Lindberg | G06F 3/0611 |
| 2022/0004326 A1 | * | 1/2022 | Kim | G06F 3/0623 |
| 2022/0137870 A1 | * | 5/2022 | Yamamoto | G06F 3/0655 |
| | | | | 711/154 |

FOREIGN PATENT DOCUMENTS

| | | |
|---|---|---|
| KR | 20190120536 A | 10/2019 |
| KR | 102079939 B1 | 2/2020 |
| KR | 20200021819 A | 3/2020 |
| KR | 20210026871 A | 3/2021 |

* cited by examiner

Primary Examiner — Tracy A Warren
(74) Attorney, Agent, or Firm — Perkins Coie LLP

(57) ABSTRACT

A storage device having improved performance includes: a plurality of memory devices, each memory device including a plurality of memory blocks, the plurality of memory devices coupled to a channel; and a memory controller coupled to the channel to be in communication with the plurality of memory devices to provide a read command for instructing a read operation on the plurality of memory blocks to read out data and provide a read enable signal to the memory devices during at least part of an idle time of the channel, which occurs while the read operation is being performed. The plurality of memory devices output first data to the memory controller through the channel in response to the read enable signal, wherein the first data is different from the data previously read out by the read operation that provides the read enable signal in response to the read command.

18 Claims, 14 Drawing Sheets

DATA STORAGE DEVICE FOR PERFORMING READ OPERATION AND OPERATING METHOD THEREOF

CROSS-REFERENCE TO RELATED APPLICATION

This patent application document claims the priority and benefits of the Korean patent application number 10-2021-0064881, filed May 20, 2021, which is incorporated herein by reference in its entirety.

TECHNICAL FIELD

The disclosed technology generally relates to an electronic device, and more particularly, to a data storage device and an operating method thereof.

BACKGROUND

A data storage device is used to store data under the control of a host device such as a computer or a smart phone. The storage device may include a memory device for storing data and a memory controller for controlling the memory device. The memory device is classified into a volatile memory device and a nonvolatile memory device.

The volatile memory device only retains its data while the device is powered and loses its data when power is lost. Examples of the volatile memory device may include a Static Random Access Memory (SRAM) and a Dynamic Random Access Memory (DRAM).

The nonvolatile memory device retains stored data even in the absence of power supply and thus does not lose its data when power is lost. Examples of the nonvolatile memory device may include a Read Only Memory (ROM), a Programmable ROM (PROM), an Electrically Programmable ROM (EPROM), an Electrically Erasable ROM (EEROM), and a flash memory.

SUMMARY

The embodiments of the disclosed technology relate to a data storage device that can reduce the time it takes to transition from an idle state to an active state by activating channels in an idle state if those channels meet certain criteria.

In an aspect of the disclosed technology, a storage device includes: a plurality of memory devices, each memory device including a plurality of memory blocks for storing data, the plurality of memory devices coupled to a channel; and a memory controller coupled to the channel to be in communication with the plurality of memory devices to provide a read command for instructing a read operation on the plurality of memory blocks to read out data and provide a read enable signal to the memory devices during at least part of an idle time of the channel, which occurs while the read operation is being performed, and wherein the plurality of memory devices output first data to the memory controller through the channel in response to the read enable signal, wherein the first data is different from the data previously read out by the read operation that provides the read enable signal in response to the read command.

In another aspect of the disclosed technology, a method for operating a storage device that includes a plurality of memory devices coupled to a channel and a memory controller for controlling the plurality of memory devices through the channel is disclosed. The method includes providing the plurality of memory devices with a read command corresponding to a read request of a host in response to the read request; detecting an idle time of the channel, which occurs while a read operation corresponding to the read command is being performed; providing a read enable signal to the plurality of memory devices during the idle time; and outputting first data through the channel in response to the read enable signal.

In another aspect of the disclosed technology, a storage device including: a plurality of memory devices each including a plurality of memory blocks, the plurality of memory devices being connected through one channel; and a memory controller configured to provide the plurality of memory devices with a read command instructing a read operation of reading read data from the plurality of memory blocks, detect an idle time of the channel, which occurs while the read operation is being performed in the plurality of memory devices, and provide a read enable signal to the memory devices during the idle time, wherein the plurality of memory devices output dummy data to the memory controller through the channel in response to the read enable signal.

In another aspect of the disclosed technology, a method for operating a storage device including a plurality of memory devices commonly connected to one channel and a memory controller for controlling the plurality of memory devices through the channel is disclosed. The method includes: providing the plurality of memory devices with a read command corresponding to a read request of a host in response to the read request; detecting an idle time of the channel, which occurs while a read operation corresponding to the read command is being performed; providing a read enable signal to the plurality of memory devices during the idle time; and outputting dummy data through the channel in response to the read enable signal.

DETAILED DESCRIPTION

The embodiments of the disclosed technology relate to a data storage device than can perform transition from an idle state to an active state more effectively.

Figure 1:
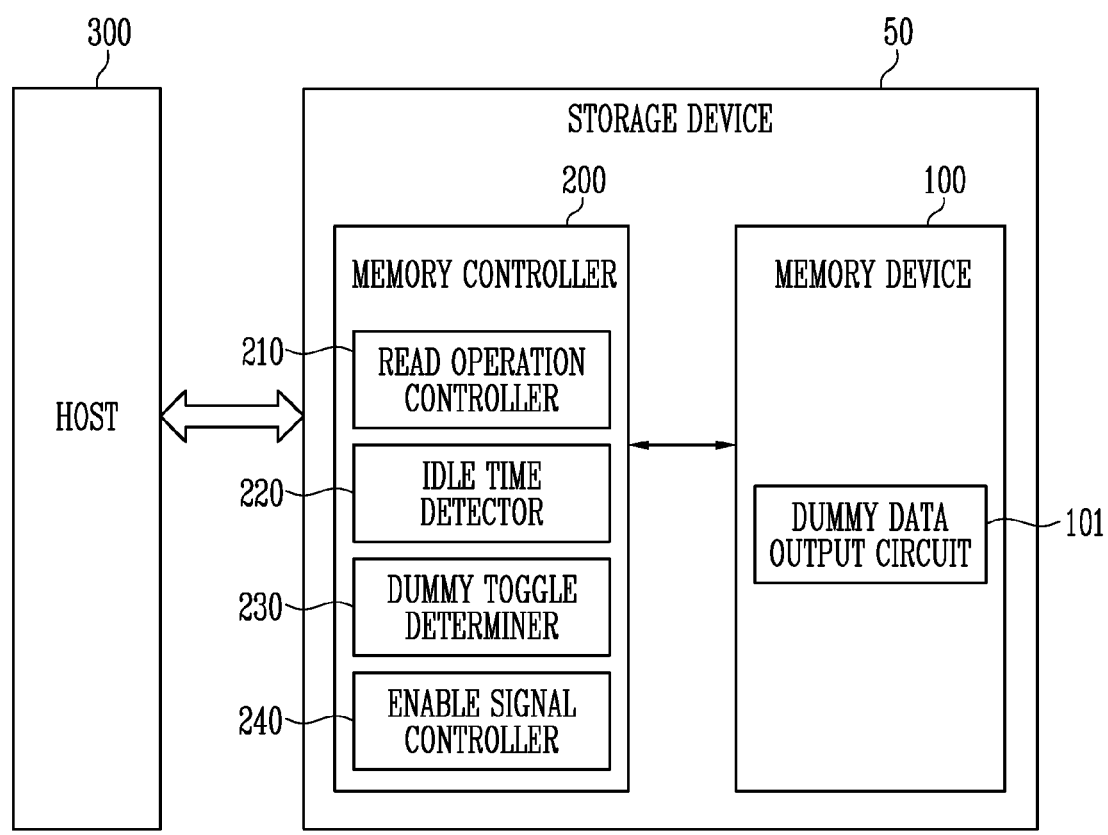
FIG. 1 is a diagram illustrating a storage device based on an embodiment of the disclosed technology.

FIG. 1 is a diagram illustrating a storage device based on an embodiment of the disclosed technology.

Referring to FIG. 1, the storage device (e.g., data storage device) 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and others.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or others. In this specification, for convenience of description, a case where the memory device 100 is a NAND flash memory is assumed and described. The memory device 100 may receive a command CMD and an address ADDR from the memory controller 200, and access an area selected by the address ADDR in the memory cell array. The memory device 100 may perform an operation indicated by the command CMD on the area selected by the address ADDR. For example, the memory device 100 may perform a write operation (program operation), a read operation, and an erase operation. In the program operation, the memory device 100 may program data in the area selected by the address ADDR. In the read operation, the memory device 100 may read data from the area selected by the address ADDR. In the erase operation, the memory device 100 may erase data stored in the area selected by the address ADDR.

By way of example, FIG. 1 illustrates the storage device 50 as having one memory device 100, but the storage device 50 may include more than one memory device. A connection relationship between the plurality of memory devices and the memory controller 200 will be described with reference to FIG. 2.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA can include any logic address or virtual address that does not physically exist but is mapped to a physical address. In addition, the PBA can include a physical address of memory cell, page or block that exists physically.

The memory controller 200 may control the memory device 100 to perform a program operation, a read operation, an erase operation, in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may be connected to the memory device 100 through a channel. For example, the memory controller 200 may provide a command and an address to the memory device 100 through the channel, to control the memory device 100 to perform a program operation, a read operation, an erase operation, or others.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving scheme so as to improve operational performance. The interleaving scheme may be a scheme for controlling operations on at least two memory devices 100 to overlap with each other.

In an embodiment, the memory controller 200 may include a read operation controller 210, an idle time detector 220, a dummy toggle determiner 230, and an enable signal controller 240.

The read operation controller 210 may control the memory device 100 to perform a read operation in response to a read request of the host. For example, the read operation controller 210 may generate a read command instructing the read operation, and provide the read command to the memory device 100. The memory device 100 may read data corresponding to the read command from a plurality of memory blocks. The data may be stored in a page buffer in the memory device 100. Also, the read operation controller 210 may generate a data output command instructing the memory device 100 to output the read command, and provide the data output command to the memory device 100. For example, the read operation controller 210 may provide the read command and then provide the data output command to the memory device 100 according to an operation state of the memory device 100. The memory device 100 may output the data stored in the page buffer to the memory controller 200 according to the data output command.

The idle time detector 220 may detect an idle time of a channel, which occurs while the read operation is being performed in the memory device 100. In an embodiment, the idle time may represent a time from after the read command is provided through the channel to a time at which the data is output through the channel. Also, the idle time may include a time from after the data output command is provided through the channel to the time at which the data is output through the channel.

The dummy toggle determiner 230 may determine whether a read enable signal is to be output, based on a result obtained by comparing the idle time with a predetermined threshold value. The value of the threshold value may vary depending on the settings. In some implementations, the read enable signal that is generated based on the determination of the dummy toggle determiner 230 may be a read enable signal that is generated to generate "dummy" data, which is benign information that does not contain any useful data. In some implementations, such a read enable signal can be referred to as a "dummy" read enable signal, which generates the "dummy" read data even during an idle state.

In an embodiment, when the idle time exceeds the predetermined threshold value, the dummy toggle determiner 230 may control the signal controller 240 to provide the read enable signal.

The enable signal controller 240 may provide the read enable signal to the memory device 100 during the idle time.

For example, the enable signal controller 240 may generate the read enable signal during the idle time, and provide the read enable signal to the memory device 100. In an embodiment, the enable signal controller 240 may periodically provide the read enable signal to the memory device 100 during the idle time.

In an embodiment, when the idle time exceeds the predetermined threshold value, the enable signal controller 240 may provide the read enable signal to the memory device 100. For example, the enable signal controller 240 may provide the read enable signal to the memory device 100 during the idle time under the control of the dummy toggle determiner 230.

In an embodiment, the memory device 100 may include a dummy data output circuit 101.

The dummy data output circuit 101 may output dummy data to the memory controller 200 through the channel in response to the read enable signal. For example, the dummy data output circuit 101 may generate dummy data according to the read enable signal, and output the dummy data through the channel. Here, the read enable signal that generates the dummy data is the read enable signal that is generated based on the determination of the dummy toggle determiner 230. For example, the read enable signal that generates the dummy data is the "dummy" read enable signal that generates "dummy" read data even during an idle state In an embodiment, the dummy data output circuit 101 may periodically output dummy data in response to the periodically provided read enable signal.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
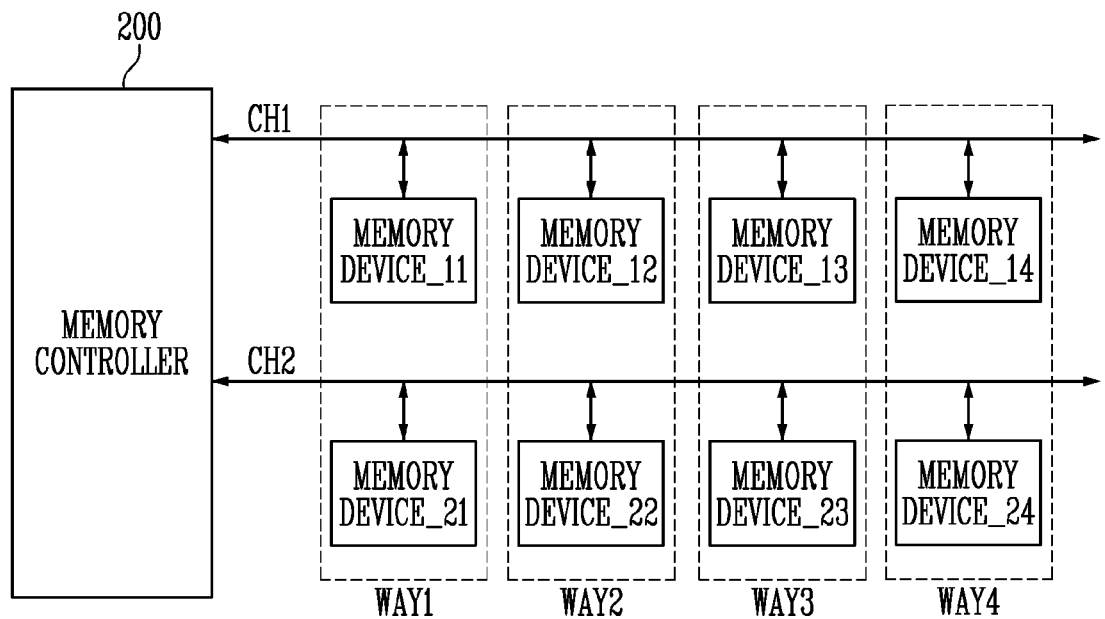
FIG. 2 is a block diagram illustrating example configurations of a memory controller and a memory device shown in FIG. 1 and channels (or buses) that connect the memory controller to memory devices.

FIG. 2 is a block diagram illustrating example configurations of the memory controller and the memory device shown in FIG. 1 and channels (e.g., buses) that connect the memory controller to memory devices.

Referring to FIG. 2, the memory controller 200 may be connected to a plurality of memory devices (memory device_11 to memory device_24) through a plurality of channels CH1 and CH2. The number of channels and/or the number of memory devices connected to each channel may vary depending on implementations. By way of example only, FIG. 2 illustrates that the memory controller 200 is connected to memory devices through two channels, and four memory devices are connected to each channel.

For convenience of description, an operation of memory device_11, memory device_12, memory device_13, and memory device_14, which are connected to a first channel CH1, will be described below. The operational features of memory devices (memory device_21 to memory device_24) that are connected to the other channel CH2 are similar or identical to the memory device_11, the memory device_12, the memory device_13, and the memory device_14.

The memory device_11 to the memory device_14 may be connected to the first channel CH1 in common. The memory device_11 to the memory device_14 may communicate with the memory controller 200 through the first channel CH1. Since the memory device_11 to the memory device_14 are connected in common through the first channel CH1, only one memory device may communicate with the memory controller 200 at a time. However, operations that are internally performed respectively by the memory device_11 to the memory device_14 may be simultaneously performed.

The storage device using a plurality of memory devices can improve performance by using the interleaving scheme described with reference to FIG. 1. In order to use the interleaving scheme, the memory devices may be managed in units of channels and ways. In order to maximize the parallelization of memory devices connected to each channel, the memory controller 200 may distribute and allocate a continuous logical memory area on a channel and way basis.

For example, the memory controller 200 may transmit a command, a control signal including an address, and data to the memory device_11 through the first channel CH1. While the memory device_11 is writing the received data in a memory cell of the memory device_11, the memory controller 200 may transmit a command, a control signal including an address, and data to the memory device_12.

In FIG. 2, the plurality of memory devices may constitute four ways WAY1 to WAY4. A first way WAY1 may include the memory device_11 and the memory device_21. A second way WAY2 may include the memory device_12 and the memory device_22. A third way WAY3 may include the memory device_13 and the memory device_23. A fourth way WAY4 may include the memory device_14 and the memory device_24.

Each of the channels CH1 and CH2 may be a bus that transfers data and/or other signals that are shared and used by memory devices connected to the corresponding channel.

Although FIG. 2 illustrates a 2-channel/4-way interleaving by way of example, the disclosed technology can be implemented in some embodiments to increase the number of channels and the number of ways to improve the efficiency of the interleaving.

Figure 3:
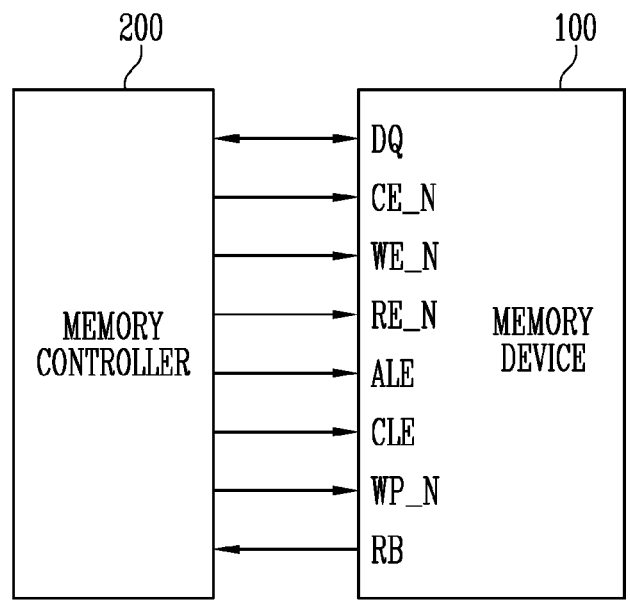
FIG. 3 is a diagram illustrating signals that are transmitted and received between the memory controller and the memory device shown in FIG. 1.

FIG. 3 is a diagram illustrating signals that are transmitted and received between the memory controller and the memory device shown in FIG. 1.

Referring to FIG. 3, the memory device 100 may communicate with the memory controller 200 through an input/output (DQ) line, a chip enable (CE) line, a write enable (WE_N) line, a read enable (RE_N) line, an address latch enable (ALE) line, a command latch enable (CLE) line, a write protect (WP_N) line, and a ready/busy (RB) line.

In FIG. 3, a connection structure between a single memory device 100 and the memory controller 200 is illustrated by way of example only. In some embodiments, the disclosed technology can be implemented to provide a connection structure between the memory controller 200 and a plurality of memory devices. For example, the memory controller 200 can be coupled via a connection structure to the memory device_11 . . . the memory device_14 and the memory device_21 . . . the memory device_24 as shown in FIG. 2. For example, the input/output (DQ) line, the chip enable (CE) line, the write enable (WE_N) line, the read enable (RE_N) line, the address latch enable (ALE) line, the command latch enable (CLE) line, the write protect (WP_N) line, and the ready/busy (RB) line may be included in one channel, and the memory controller 200 and the plurality of memory devices (the memory device_11 to the memory device_14 or the memory device_21 to the memory device_24) may be connected to each other through the corresponding channel. Therefore, when the memory controller 200 transmits signals through lines included in one channel, all memory devices (the memory device_11 to the memory device_14 or the memory device_21 to the memory device_24) connected to the corresponding channel or a memory device selected by the memory controller 200 among the memory devices (the memory device_11 to the memory device_14 or the memory device_21 to the memory device_24) connected to the corresponding channel may receive the signals.

The input/output (DQ) line may input a command, an address, and data to the memory device 100, or output data from the memory device 100 to the memory controller 200. The input/output (DQ) line may be configured with 8 lines to transmit/receive 8-bit data, and each line may transmit/receive 1-bit data. However, the number of input/output (DQ) lines is not limited to 8, and may be extended to 16 or 32 in various embodiments.

The chip enable (CE) line may transfer a chip enable (CE) signal to indicate that an operation of the memory device 100 is possible. The chip enable (CE) signal may be selectively applied to memory devices connected to the same channel. When the chip enable (CE) signal falls to low, the chip enable (CE) signal may indicate that all operation in a corresponding memory device 100 is possible. When the chip enable (CE) signal is high, the chip enable (CE) signal may indicate that the corresponding memory device 100 is in a standby state.

The memory device 100 may receive a read enable (RE_N) signal through the read enable (RE_N) line, and receive a write enable (WE_N) signal through the write enable (WE_N) line. The read enable (RE_N) signal may be toggled when data is loaded to the memory controller 200, and the write enable (WE_N) signal may be toggled when a command and an address are loaded to the memory device 100. The command and the address may be input to a selected memory device 100, when the write enable (WE_N) signal is changed from low to high, i.e., at a rising edge of the write enable (WE_N) signal. In another embodiment, the command and the address may be input to the selected memory device 100 when the write enable (WE_N) signal is changed from high to low, i.e., at a falling edge of the write enable (WE_N) signal.

The memory device 100 may receive a command latch enable (CLE) signal through the command latch enable (CLE) line. While a command CMD is input to the memory device 100, the command latch enable (CLE) signal may become high. In addition, the memory device 100 may receive an address latch enable (ALE) signal through the address latch enable (ALE) line. While an address is input to the memory device 100, the address latch enable (ALE) signal may become high.

The memory device 100 may receive a write protect (WP_N) signal through the write protect (WP_N) line. The write protect (WP_N) signal may be a signal for inactivating program and erase operations of the memory cell array.

While an operation is performed in the memory device 100, a ready/busy (RB) signal transferred to the read/busy (RB) line may have a logic low or low voltage state. When the ready/busy (RB) signal is in the logic low state, the memory device 100 does not exchange any signal with the outside. When the ready/busy (RB) signal is at a high level, the memory device 100 is in a ready state. When the memory device 100 is in the ready state, the memory device 100 may exchange a signal with the outside.

Figure 4:
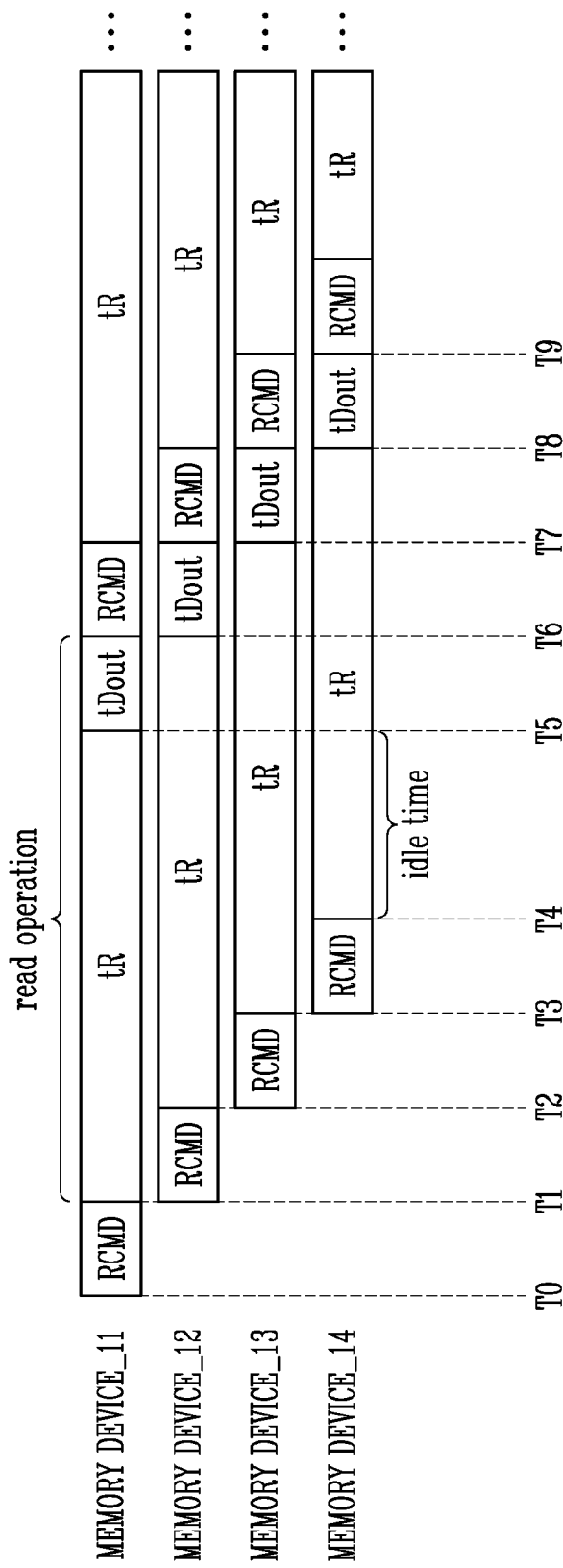
FIG. 4 is a diagram illustrating an idle time based on an embodiment of the disclosed technology.

FIG. 4 is a diagram illustrating an idle time based on an embodiment of the disclosed technology.

In an embodiment, a read operation of the memory devices shown in FIG. 2 can be performed based on a timing diagram illustrated in FIG. 4. For convenience of description, an operation of the memory device_11, the memory device_12, the memory device_13, and the memory device_14, which are connected to the first channel CH1, is described. The operational features of the memory devices (memory device_21 to memory device_24) that are connected to the other channel CH2 are similar or identical to the memory device_11, the memory device_12, the memory device_13, and the memory device_14.

During the time period from T0 to T1, the memory device_11 may receive a read command RCMD through the channel. Subsequently, the memory device 11 may read data in response to the read command.

Since the memory devices (the memory device_11 to the memory device_14) share the channel, the memory device_12, the memory device_13, and the memory device_14 cannot communicate with the memory controller 200 during the time period from T0 to T1.

During the time period from T1 to T2, the memory device_12 may receive a read command RCMD through the channel. Subsequently, the memory device_12 may read data according to the read command. Since the memory devices (the memory device_11 to the memory device_14) share the channel, the memory device_11, the memory device_13, and the memory device_14 cannot communicate with the memory controller 200 during the time period from T1 to T2.

During the time period from T2 to T3, the memory device-13 may receive a read command RCMD through the channel. Subsequently, the memory device_13 may read data according to the read command. Since the memory devices (the memory device_11 to the memory device_14) share the channel, the memory device_11, the memory device_12 and the memory device_14 cannot communicate with the memory controller 200 during the time period from T2 to T3.

During the time period from T3 to T4, the memory device-14 may receive a read command RCMD through the channel. Subsequently, the memory device_14 may read data according to the read command. Since the memory devices (the memory device_11 to the memory device_14) share the channel, the memory device_11, the memory device_12 and the memory device_13 cannot communicate with the memory controller 200 during the time period from T3 to T4.

During the time period from T1 to T5, the memory device_11 may read data from a plurality of memory blocks. Subsequently, during the time period from T5 to T6, the memory device_11 may output the data through the channel. For example, the memory device_11 may receive a data output command through the channel, and output the data according to the data output command. Since the memory devices (the memory device_11 to the memory device_14) share the channel, the memory device_12, the memory device_13, and the memory device_14 cannot communicate with the memory controller during the time period from T5 to T6. In an embodiment, the time required to perform the read operation may include a time tR it takes for the memory device_11 to read the data from the plurality of memory blocks and a time tDout it takes for the memory device_11 to output the data through the channel.

During the time period from T2 to T6, the memory device_12 may read data from a plurality of memory blocks. Subsequently, during the time period from T6 to T7, the memory device_12 may output the data through the channel. For example, the memory device_12 may receive a data output command through the channel, and output the data in response to the data output command. Since the memory devices (the memory device_11 to the memory device_14) share the channel, the memory device_11, the memory device_13, and the memory device_14 cannot communicate with the memory controller 200 during T6 to T7.

During the time period from T3 to T7, the memory device_13 may read data from a plurality of memory blocks. Subsequently, during T7 to T8, the memory device_13 may output the data through the channel. For example, the memory device_13 may receive a data output a data output command through the channel, and output the data according to the data output command. Since the memory devices (the memory device_11 to the memory device_14) share the channel, the memory device_11, the memory device_12, and the memory device_14 cannot communicate with the memory controller 200 during the time period from T7 to T8.

During the time period from T4 to T8, the memory device_14 may read data from a plurality of memory blocks. Subsequently, during T8 to T9, the memory device_14 may output the data through the channel. For example, the memory device_14 may receive the data output command through the channel, and output the data according to the data output command. Since the memory devices (the memory device_11 to the memory device_14) share the channel, the memory device_11, the memory device_12, and the memory device_13 cannot communicate with the memory controller 200 during the time period from T8 to T9.

During T4 to T5, the memory devices (the memory device_11 to the memory device_14 are all performing the read operation, and the channel is in an idle state. Therefore, the period T4 to T5 is an idle time of the channel.

In a case that the channel is suddenly transitioned from an idle state to an activated state, a switching noise can affect a subsequent normal operations that are controlled by the memory controller 200. The impact of the switching noise can be minimized by increasing the toggle period of the read enable signal in an initial data output operation performed after the idle state. However, the increase in the toggle period of the read enable signal can lead to an undesirable decrease in the speed of the read operation.

In some embodiments of the disclosed technology, the memory device is controlled to output "dummy" data through the channel by activating the channel during the idle time. As discussed above, a read enable signal (e.g., "dummy" read enable signal) can be generated during an idle time to activate the channel and output the dummy data through the channel. In this way, the storage device 50 based on some embodiments of the disclosed technology can avoid such a decrease in the read operation speed, thereby improving the performance of the storage device 50.

Figure 5:
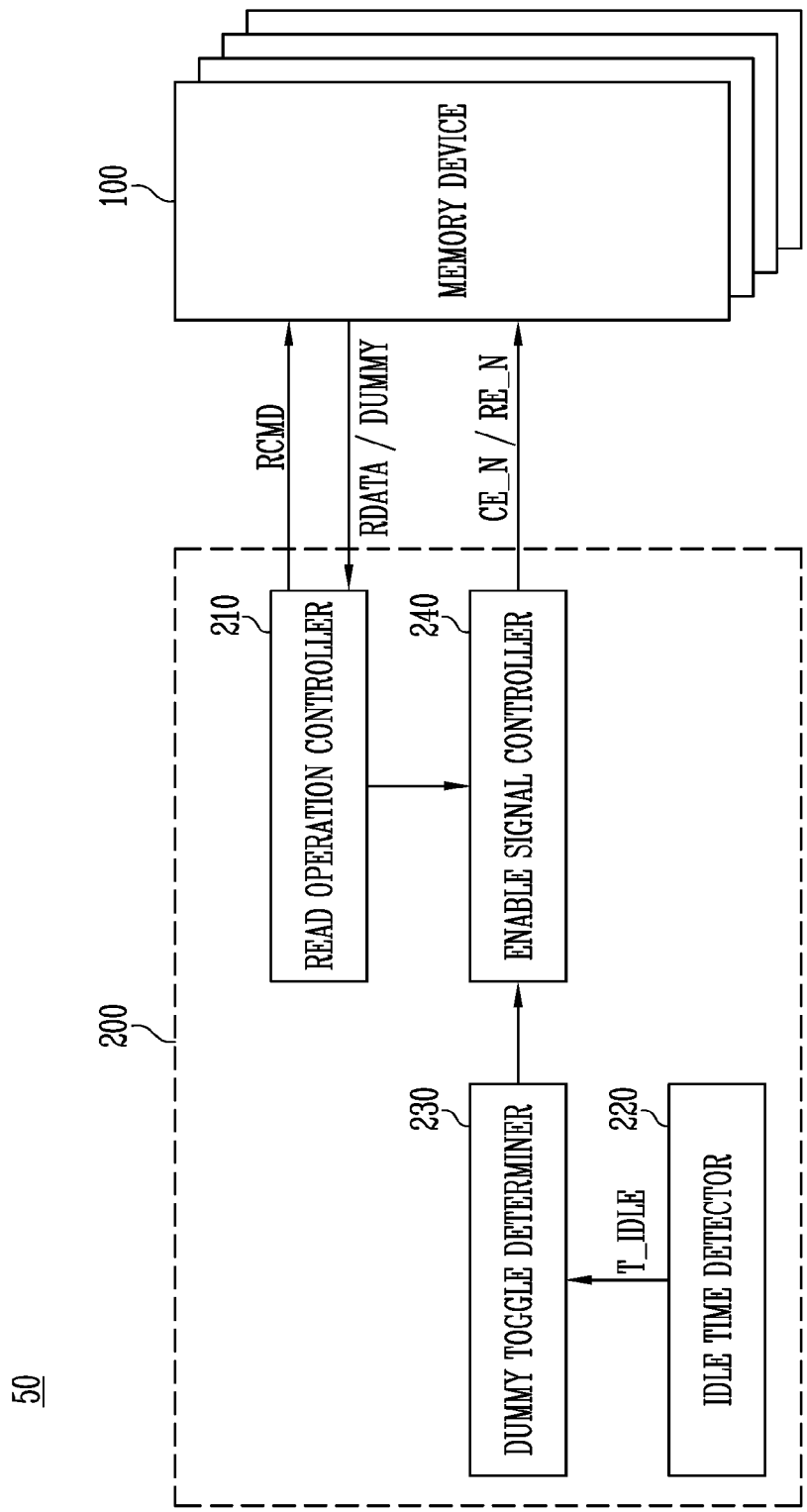
FIG. 5 is a diagram illustrating a configuration and an operation of a storage device based on an embodiment of the disclosed technology.

FIG. 5 is a diagram illustrating a configuration and an operation of a storage device based on an embodiment of the disclosed technology.

Referring to FIG. 5, the storage device 50 may include a plurality of memory devices 100 and a memory controller 200. Each of the plurality of memory devices 100 may include the dummy data output circuit 101 shown in FIG. 1.

The memory controller 200 may include a read operation controller 210, an idle time detector 220, a dummy toggle determiner 230, and an enable signal controller 240.

The read operation controller 210 may provide a read command RCMD to the plurality of memory devices 100 based on a read request of the host 300.

In an embodiment, the read operation controller 210 may control the enable signal controller 240 to generate a chip enable (CE_N) signal for selecting a plurality of memory devices 100 corresponding to the read request. The enable signal controller 240 may generate the chip enable (CE_N) signal (e.g., logic low state) to activate a certain memory device or a certain area of the memory device. The read operation controller 210 may provide the read command RCMD to the plurality of memory devices 100 that are activated in response to the chip enable (CE_N) signal. The plurality of memory devices 100 may read data RDATA in response to the read command RCMD. Also, after the read operation controller 210 provides the read command RCMD, the read operation controller 210 may provide a data output command to a memory device 100 through a channel. The memory device 100 may provide read data to the memory controller 200 according to the data output command.

The idle time detector 220 may detect an idle time T_IDLE of the channel, which occurs while a read operation is being performed in the plurality of memory devices 100.

In an embodiment, the idle time T_IDLE may include a time period from a point in time when the read command RCMD is provided through the channel to a point in time when the data RDATA is output through the channel. Also, the idle time T_IDLE may include a time period from a point in time when the data output command is provided through the channel to a point in time when the data RDATA is output through the channel.

In an embodiment, the idle time detector 220 may detect the idle time T_IDLE, based on a time required for a host device or a memory controller to read data from the plurality of memory devices 100 in response to the read command and based on a time required for the host device or the memory controller to write data to the plurality of memory devices 100 in response to a program command.

For example, the idle time detector 220 may provide a status read command to a plurality of memory devices 100 to perform a read operation or a program operation. The idle time detector 220 may acquire status information from the plurality of memory devices 100 through a status read response. The idle time detector 220 may check an operation state of the plurality of memory devices 100, based on the status information, and calculate the idle time T_IDLE based on the operation state, the point in time when the status read command is provided, the point in time when the status information is received.

In an embodiment, the status information may be stored in a status register included in the memory devices 100. The status information may include information as to whether operations performed on the memory devices 100 are successful or not. The status information may also include information as to whether the memory device 100 is in a "ready" state or a "busy" state. For example, the status information can be used to indicate a start time or an end time of the read operation. Therefore, the idle time detector 220 may detect the idle time T_IDLE based on the status information.

The disclosed technology can be implemented in some embodiments to generate a read enable signal during an "idle" time, thereby minimizing the impact that would have been caused by the switching error. In some implementations, the dummy toggle determiner 230 may determine whether to generate a read enable (RE_N) signal by comparing the idle time T_IDLE with a predetermined threshold value. The threshold value may vary depending on settings. The dummy toggle determiner 230 may receive the idle time T_IDLE from the idle time detector 220, and compare the idle time T_IDLE with the threshold value.

In an embodiment, when the idle time T_IDLE exceeds the predetermined threshold value, the dummy toggle determiner 230 may control the enable signal controller 240 to provide the read enable (RE_N) signal to the memory device 100. When the idle time T_IDLE does not exceed the predetermined threshold value, the read operation of the plurality of memory devices 100 may be performed without outputting dummy data.

The enable signal controller 240 may provide the read enable (RE_N) signal to the plurality of memory devices 100 during the idle time T_IDLE. The read enable (RE_N) signal provided during the idle time T_IDLE may be used to control the plurality of memory devices 100 to output dummy data DUMMY.

In an embodiment, when the idle time T_IDLE exceeds the predetermined threshold value, the enable signal controller 240 may generate the read enable (RE_N) signal. Subsequently, the enable signal controller 240 may provide the generated read enable (RE_N) signal to the memory device 100.

In an embodiment, the enable signal controller 240 may periodically provide the read enable (RE_N) signal to the plurality of memory devices 100 during the idle time T_IDLE. That is, the enable signal controller 240 may periodically toggle the read enable (RE_N) signal during the idle time T_IDLE.

In an embodiment, the enable signal controller 240 may decrease the period of the toggling read enable (RE_N) signal as the idle time T_IDLE elapses. For example, the enable signal controller 240 may decrease the toggle period of the read enable (RE_N). Accordingly, the enable signal controller 240 can provide the read enable (RE_N) signal more quickly.

In an embodiment, the plurality of memory devices 100 may output the dummy data DUMMY to the memory controller 200 through the channel in response to the read enable (RE_N) signal.

For example, the plurality of memory devices 100 may periodically output the dummy data DUMMY in response to the periodically provided read enable (RE_N).

In an embodiment, the dummy data DUMMY may include status information having a logic value that is inverted whenever the status information is output. For example, the plurality of memory devices 100 may output, as the dummy data DUMMY, status information having a logic value that is inverted whenever the status information is periodically output. For example, the plurality of memory devices 100 may output, as the dummy data DUMMY, status information having a first logic value. In a next period, the plurality of memory devices 100 may output, as the dummy data DUMMY, status information having a second logic value, which is opposite to the first logic value. In a next period, the plurality of memory devices 100 may output, as the dummy data DUMMY, status information having the first logic value opposite to the second logic value. In one example, the read operation controller 210 does not provide the received dummy data DUMMY to a host device or a memory controller. As described above, the plurality of memory devices 100 periodically toggles the logic value of the status information to warm up the channel during the idle time T_IDLE.

When the status information is output as the dummy data DUMMY, it may be necessary for the read operation controller 210 to check an operation state of the plurality of memory devices 100. The read operation controller 210 may provide a status read command while the read operation controller 210 is periodically providing the read enable (RE_N) signal. The plurality of memory devices 100 may provide a status read response to the read operation controller 210 in response to the status read command. The read operation controller 210 may check the operation state of the plurality of memory devices 100, based on the status information included in the status read response.

Although the dummy data DUMMY is status information having a logic value that toggles whenever the status information is output in the above-described example, the disclosed technology is not necessarily limited thereto. In some embodiments, the dummy data DUMMY may have a different format.

In an embodiment, the enable signal controller 240 may provide the read enable RE_N signal to any one of the plurality of memory devices 100. In addition, the one memory device may output the dummy data DUMMY through the channel in response to the read enable (RE_N) signal. In other words, only one out of a plurality of memory devices 100 connected to one channel may output the dummy data DUMMY. In some embodiments, the number of memory devices that output the dummy data DUMMY may vary.

Subsequently, when data RDATA is read from the plurality of memory blocks, the plurality of memory devices 100 may suspend the output of the dummy data DUMMY and output the data RDATA through the channel. The memory controller 200 may also suspend the output of the read enable (RE_N) signal and receive the data RDATA through the channel.

Figure 6:
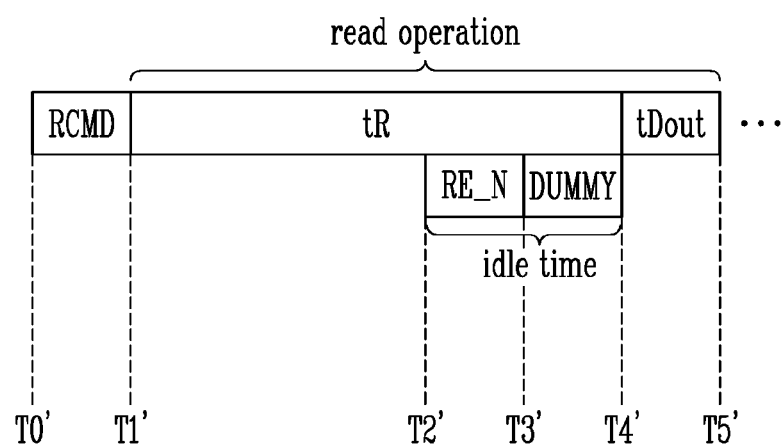
FIG. 6 is a diagram illustrating an operation of outputting dummy data based on an embodiment of the disclosed technology.

FIG. 6 is a diagram illustrating an operation of outputting dummy data based on an embodiment of the disclosed technology.

FIG. 6 shows an operation of outputting dummy data of the memory devices shown in FIG. 5. For convenience of description, an operation of one of the plurality of memory devices will be described. It will be understood that the other memory devices are operated in the same manner.

During the period from T0' to T1', the memory device may receive a read command RCMD through the channel. During T1' to T5, the memory device may perform a read operation. A period T2' to T4' may be an idle time. During the period from T2' to T3, the memory device may receive a read enable (RE_N) signal. During the period from T3' to T4', the memory device may output dummy data DUMMY through the channel in response to the read enable (RE_N) signal. Subsequently, when read data is read, the memory device may output the data during the period from T4' to T5'.

Figure 7:
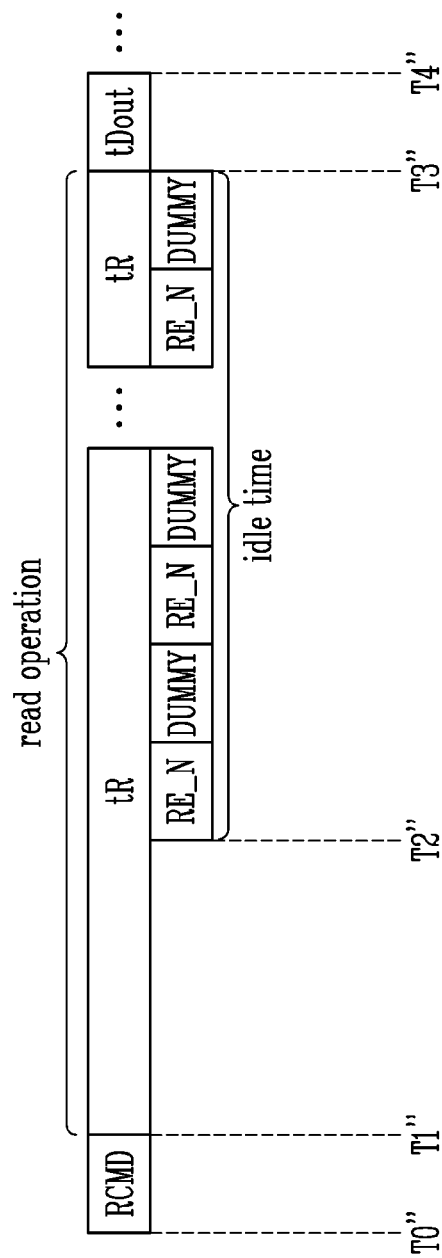
FIG. 7 is a diagram illustrating another example of an operation of outputting dummy data based on an embodiment of the disclosed technology.

FIG. 7 is a diagram illustrating another example of an operation of outputting dummy data based on an embodiment of the disclosed technology.

In an embodiment, FIG. 7 may represent a timing diagram illustrating an operation of outputting dummy data of the memory devices shown in FIG. 5. For convenience of description, an operation of any one memory device among the plurality of memory devices will be described. It will be understood that the other memory devices are operated like the one memory device.

During the period from T0" to T1", the memory device may receive a read command RCMD through the channel. During the period from T1" to T4", the memory device may perform a read operation. A period from T2" to T3" may be an idle time. During the period from T2" to T3", the memory device may periodically receive a read enable (RE_N) signal, and periodically output dummy data DUMMY through the channel in response to the periodically received read enable (RE_N) signal. Subsequently, when read data is read, the memory device may output the data during the period from T3" to T4".

Figure 8:
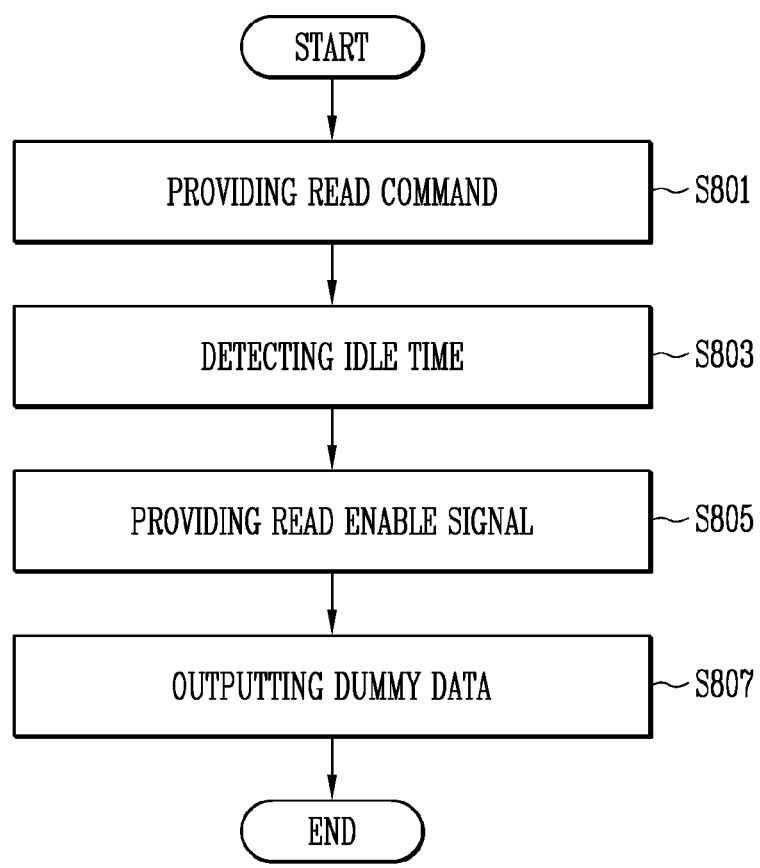
FIG. 8 is a flowchart illustrating an operating method of a storage device based on an embodiment of the disclosed technology.

FIG. 8 is a flowchart illustrating an operating method of a storage device based on an embodiment of the disclosed technology.

The operating method shown in FIG. 8 may be performed by, for example, the storage device 50 shown in FIG. 5.

Referring to FIG. 8, at S801, the storage device 50 may provide a plurality of memory devices with a read command corresponding to a read request of the host in response to the read request.

At S803, the storage device 50 may detect an idle time of a channel, which occurs while a read operation corresponding to the read command is being performed.

At S805, the storage device 50 may provide a read enable signal to the plurality of memory devices during the idle time.

The storage device 50 may periodically provide the read enable signal to the plurality of memory devices during the idle time.

Also, the storage device 50 may decrease a period in which the read enable signal is provided as the idle time elapses.

At S807, the storage device 50 may output dummy data through the channel in response to the read enable signal.

The storage device 50 may periodically output the dummy data in response to the periodically provided read enable signal.

Also, the storage device 50 may output, as the dummy data, status information having a logic value reversed whenever the status information is periodically output.

Figure 9:
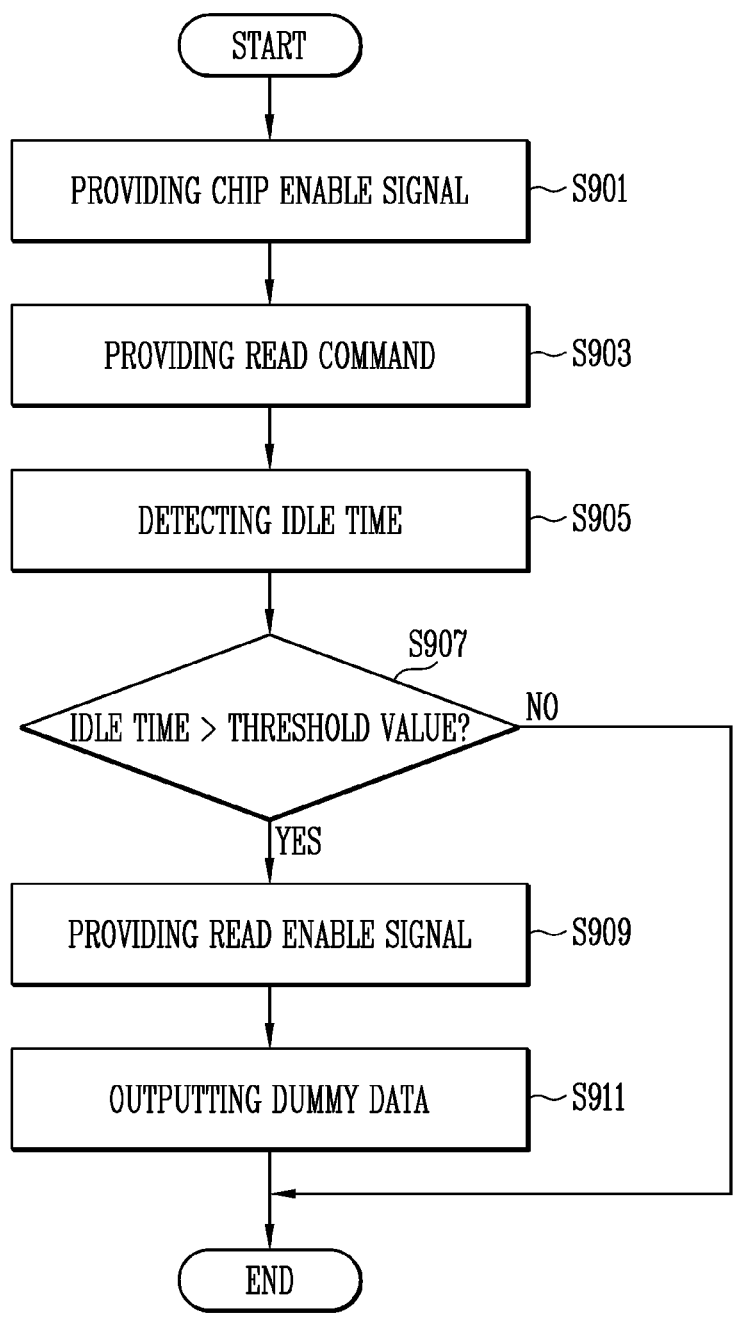
FIG. 9 is a flowchart illustrating an operating method of a storage device based on an additional embodiment of the disclosed technology.

FIG. 9 is a flowchart illustrating an operating method of a storage device based on an additional embodiment of the disclosed technology.

The operating method shown in FIG. 9 may be performed by, for example, the storage device 50 shown in FIG. 5.

Referring to FIG. 9, at S901, the storage device 50 may activate a chip enable signal for selecting a plurality of memory devices according to a read request of the host.

At S903, the storage device 50 may provide the plurality of memory devices with a read command corresponding to the read request.

The storage device 50 may provide a read command to the plurality of memory devices in which the chip enable signal is activated.

At S905, the storage device 50 may detect an idle time of a channel, which occurs while a read operation corresponding to the read command is being performed.

At S907, the storage device 50 may determine whether a read enable signal is to be output, based on a result obtained by comparing the idle time with a predetermined threshold value. For example, the storage device 50 may determine whether the idle time exceeds the threshold value. When the idle time exceeds the threshold value, the storage device 50 may perform step S909. Alternatively, when the idle time does not exceed the threshold value, the storage device 50 does not output any dummy data but may continuously perform the read operation.

In the step S909, the storage device 50 may provide the read enable signal to the plurality of memory devices during the idle time.

The storage device 50 may periodically provide the read enable signal to the plurality of memory devices during the idle time.

Also, the storage device 50 may decrease a period in which the read enable signal is provided as the idle time elapses.

At S911, the storage device 50 may output dummy data through the channel in response to the read enable signal.

The storage device 50 may periodically output the dummy data in response to the periodically provided read enable signal.

Also, the storage device 50 may output, as the dummy data, status information having a logic value reversed whenever the status information is periodically output.

Figure 10:
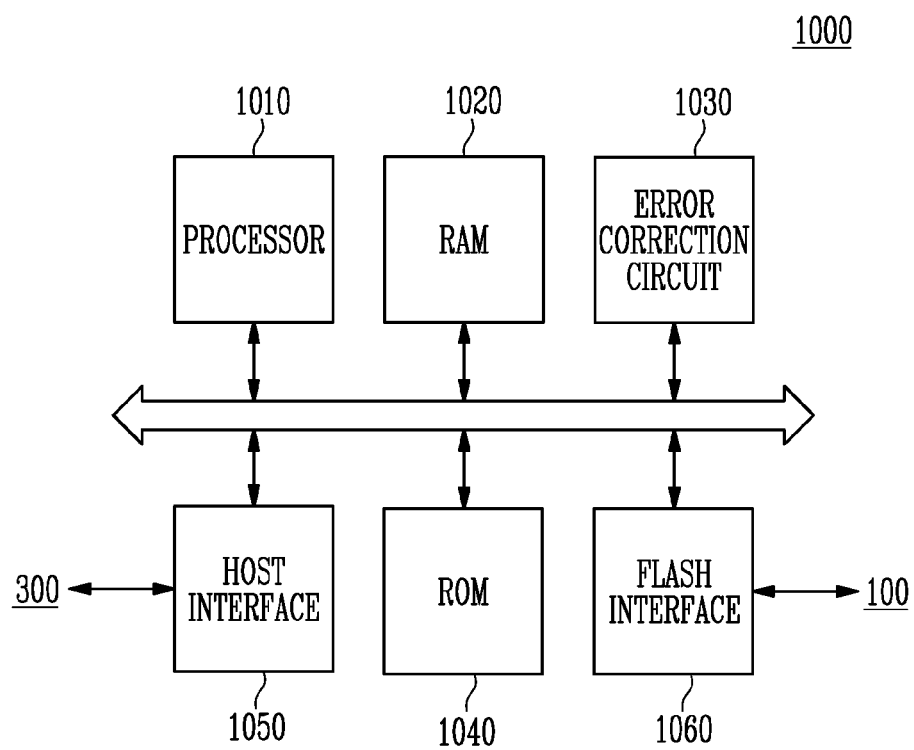
FIG. 10 is a diagram illustrating a memory controller such as that shown in FIG. 1.

FIG. 10 is a diagram illustrating a memory controller such as that shown in FIG. 1.

The memory controller 1000 may be implemented identically to the memory controller 200 described with reference to FIG. 1.

Referring to FIGS. 1 and 10, the memory controller 1000 may include a processor 1010, a RAM 1020, an error correction circuit 1030, ROM 1040, a host interface 1050, and a flash interface 1060.

The processor 1010 may control overall operations of the memory controller 1000. The RAM 1020 may be used as a buffer memory, a cache memory, a working memory, etc. of the memory controller 1000.

The error correction circuit 1030 may perform error correction. The error correction circuit 1030 may perform error correction code (ECC) encoding on data to be written to the memory device through the flash interface 1060. The ECC-encoded data may be transferred to the memory device through the flash interface 1060. The error correction circuit 1030 may perform ECC decoding on data received from the memory device through the flash interface 1060. In one example, the error correction circuit 1030 may be included as a component of the flash interface 1060 in the flash interface 1060.

The ROM 1040 may store, in the form of firmware, various information required in an operation of the memory controller 1000. In an embodiment, the read operation controller 210, the idle time detector 220, the dummy toggle determiner 230, and the enable signal controller 240, which are described with reference to FIG. 1, may be firmware stored in the ROM 1040.

The memory controller 1000 may communicate with an external device (e.g., the host 300, an application processor, or the like) through the host interface 1050.

The memory controller 1000 may communicate with the memory device 100 through the flash interface 1060. The memory controller 1000 may transmit a command, an address, a control signal, and the like to the memory device 100 through the flash interface 1060, and receive data DATA. In one example, the flash interface 1060 may include a NAND interface.

Figure 11:
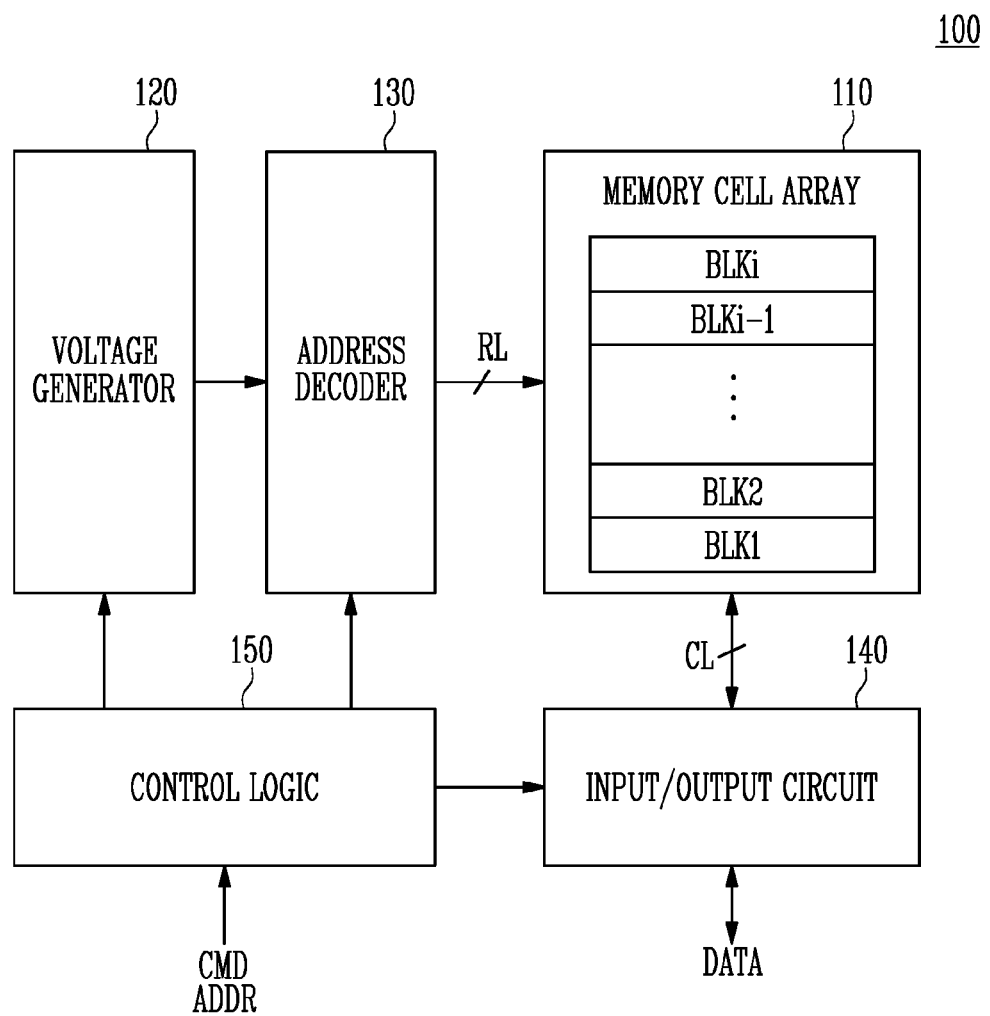
FIG. 11 is a diagram illustrating the memory device shown in FIG. 1.

FIG. 11 is a diagram illustrating the memory device shown in FIG. 1.

Referring to FIG. 11, the memory device 100 may include a memory cell array 110, a voltage generator 120, an address decoder 130, an input/output circuit 140, and a control logic 150.

The memory cell array 110 may include a plurality of memory blocks BLK1 to BLKi. The plurality of memory blocks BLK1 to BLKi may be connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

In an embodiment, the voltage generator 120, the address decoder 130, and the input/output circuit 140 may be commonly designated as a peripheral circuit. The peripheral circuit may drive the memory cell array 110 under the control of the control logic 150. The peripheral circuit may driver the memory cell array 110 to perform a program operation, a read operation, and an erase operation.

The voltage generator 120 may generate a plurality of operating voltages by using an external power voltage supplied to the memory device 100. The voltage generator 120 may operate under the control of the control logic 150.

In an embodiment, the voltage generator 120 may generate an internal power voltage by regulating the external power voltage. The internal power voltage generated by the voltage generator 120 may be used as an operating voltage of the memory device 100.

In an embodiment, the voltage generator 120 may generate a plurality of operating voltages by using the external power voltage or the internal power voltage. The voltage generator 120 may generate various voltages required in the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 120 may include a plurality of pumping capacitors which receive the internal power voltage. The voltage generator 120 may generate the plurality of operating voltages by selectively activating the plurality of pumping capacitors under the control of the control logic 150.

The plurality of operating voltages generated by the voltage generator 120 may be supplied to the memory cell array 110 by the address decoder 130.

The address decoder 130 may be connected to the memory cell array 110 through the row lines RL. The address decoder 130 may operate under the control of the control logic 150. The address decoder 130 may receive an address ADDR from the control logic 150. The address decoder 130 may decode a block address in the received address ADDR. The address decoder 130 may select at least one memory block among the memory blocks BLK1 to BLKi according to the decoded block address. The address decoder 130 may decode a row address in the received address ADDR. The address decoder 130 may select at least one word line among word lines of the selected memory block according to the decoded row address. In an embodiment, the address decoder 130 may decode a column address in the received address ADDR. The address decoder 130 may connect the input/output circuit 140 and the memory cell array 110 to each other according to the decoded column address.

In an embodiment of the disclosed technology, in a read operation, the address decoder 130 may apply a read voltage to the selected word line, and apply a read pass voltage having a level higher than that of the read voltage to unselected word lines.

In one example, the address decoder 130 may include components such as a row decoder, a column decoder, and an address decoder.

The input/output circuit 140 may include a plurality of page buffers. The plurality of page buffers may be connected to the memory cell array 110 through the bit lines. In a program operation, data stored in the plurality of page buffer may be provide a selected physical page through the bit lines, and the provided data may be stored in memory cells included in the selected physical page. In a read operation, data stored in the memory cells included in the selected physical page may be sensed through the bit lines, and the sensed data may be stored in the page buffers.

The control logic 150 may control the address decoder 130, the voltage generator 120, and the input/output circuit 140. The control logic 150 may operate in response to a command CMD transferred from an external device. The control logic 150 may control the peripheral circuit by generating control signals in response to the command CMD and the address ADDR.

In an embodiment, the dummy data output circuit 101 described with reference to FIG. 1 may be a logic stored in the control logic 150.

Figure 12:
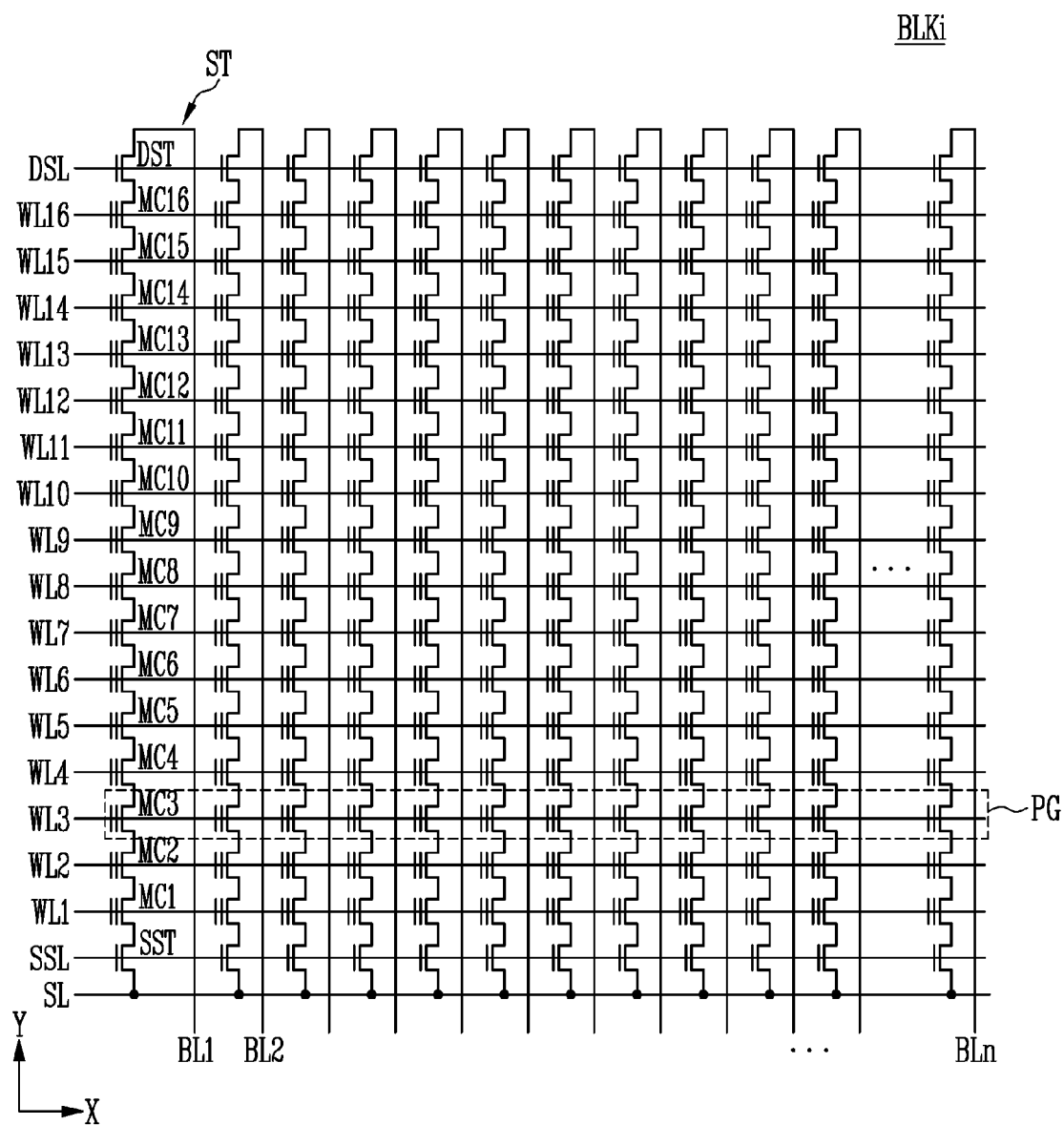
FIG. 12 is a diagram illustrating a structure of any one memory block among memory blocks shown in FIG. 11.

FIG. 12 is a diagram illustrating a structure of any one memory block among the memory blocks shown in FIG. 11.

A memory block BLKi represents any one memory block BLKi among the memory blocks BLK1 to BLKi shown in FIG. 11.

Referring to FIG. 12, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLm and a source line SL. The bit lines BL1 to BLm may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DST, which are connected in series to each other between the source line SL and the first bit line BL1. At least one drain select transistor DST may be included in one string ST, and source select transistors of which a number is greater than that of the source select transistor SST shown in the drawing and memory cells of which a number is greater than that of the memory cells MC1 to MC16 shown in the drawing may be included in the one string ST.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 may be connected to a plurality of word lines WL1 to WL16. A group of memory cells connected to the same word line among memory cells included in different strings ST may be referred to as a physical page PG. Therefore, physical pages PG corresponding to the number of the word lines WL1 to WL16 may be included in the memory block BLKi.

One memory cell may store one-bit data. The one memory cell is generally referred to as a single level cell (SLC). One physical page PG may store one logical page (LPG) data. One LPG data may include data bits corresponding to the number of cells included in the one physical page PG.

One memory cell may store two or more-bit data. One physical page PG may store two or more LPG data.

Figure 13:
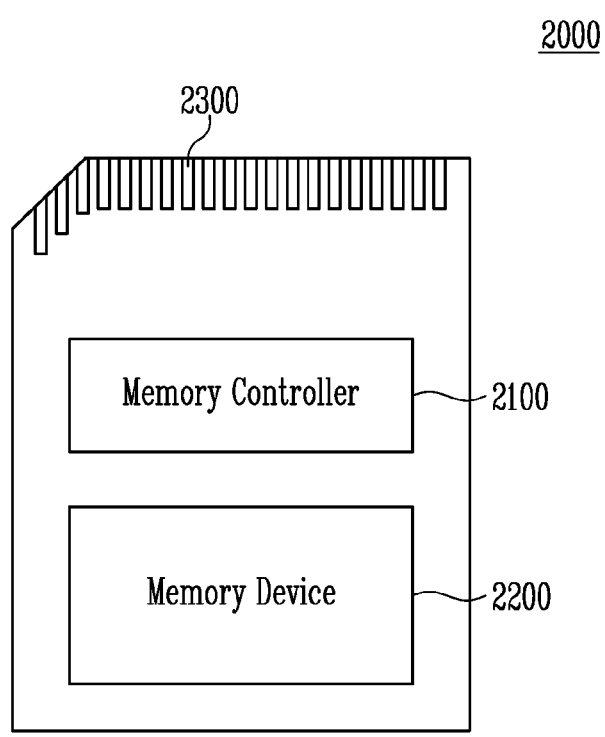
FIG. 13 is a block diagram illustrating a memory card system to which the storage device is applied based on an embodiment of the disclosed technology.

FIG. 13 is a block diagram illustrating a memory card system to which the storage device is applied based on an embodiment of the disclosed technology.

Referring to FIG. 13, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 1.

In one example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In one example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. In one example, the connector 2300 may be defined by at least one of the above-described various communication protocols.

In one example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 14:
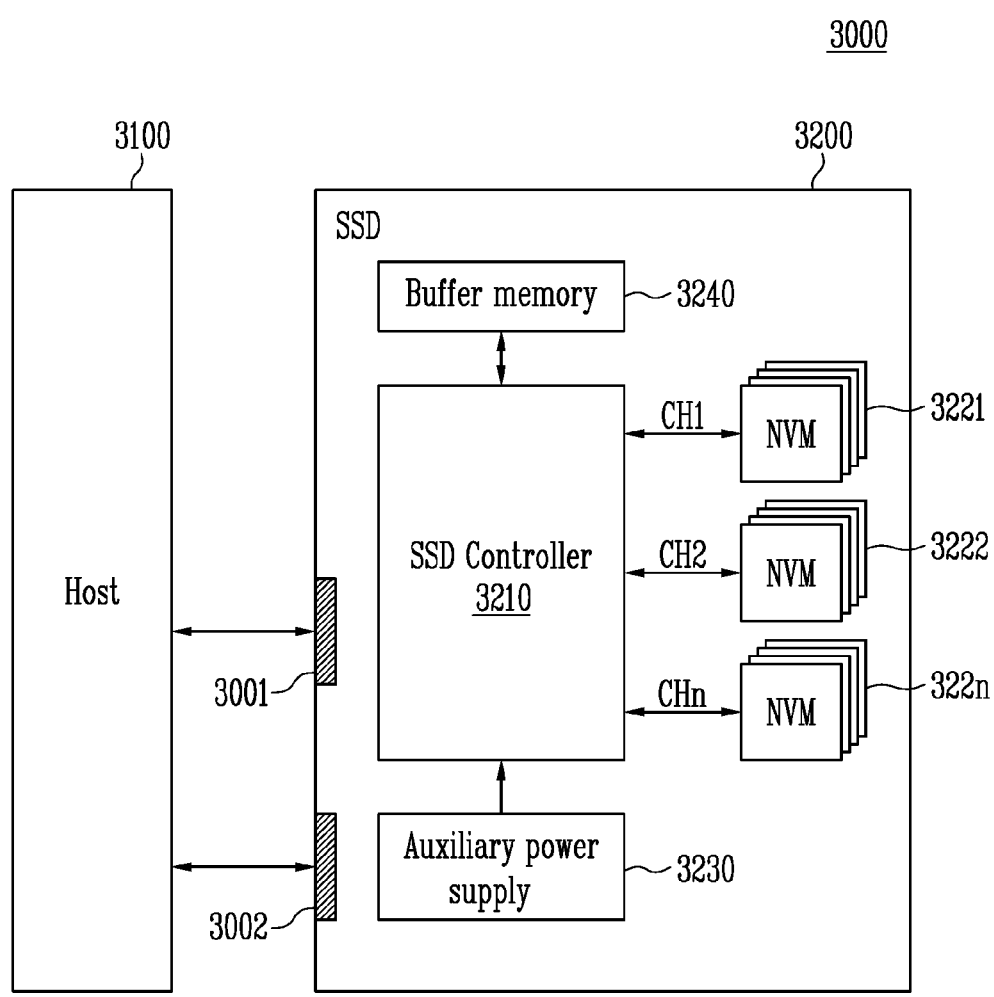
FIG. 14 is a block diagram illustrating a Solid State Drive (SSD) system to which the storage device is applied based on an embodiment of the disclosed technology.

FIG. 14 is a block diagram illustrating a Solid State Drive (SSD) system to which the storage device is applied based on an embodiment of the disclosed technology.

Referring to FIG. 14, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal received from the host 3100. In one example, the signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. In one example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 15:
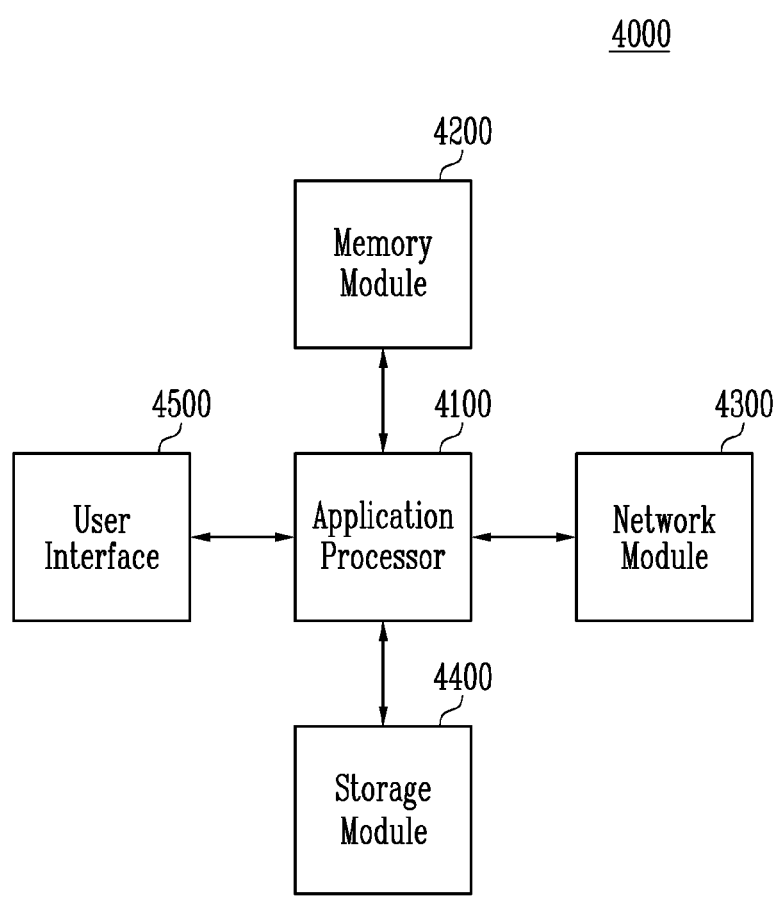
FIG. 15 is a block diagram illustrating a user system to which the storage device is applied based on an embodiment of the disclosed technology.

FIG. 15 is a block diagram illustrating a user system to which the storage device is applied based on an embodiment of the disclosed technology.

Referring to FIG. 15, the user system 4000 includes an application processor 4100, a memory module 4200, a network module 4300, a storage module 4400, and a user interface 4500.

The application processor 4100 may drive components included in the user system 4000, an operating system (OS), a user program, or the like. In one example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In one example, the application processor 4100 and the memory module 4200 may be provided as one semiconductor package by being packaged based on a Package on Package (PoP).

The network module 4300 may communicate with external devices. In one example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In one example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In one example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In one example, the storage module 4400 may be provided as a removable drive such as a memory card of the user system 4000 or an external drive.

In one example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In one example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In some embodiments of the disclosed technology, there can be provided a storage device capable of decreasing switching noise by warming up a channel, and an operating method of the storage device.

While specific embodiments of the disclosed technology have been described in this patent application document, various changes and modifications of the disclosed embodiments and other embodiments may be made based on the disclosure of this patent application document.

What is claimed is:

1. A storage device comprising:
a plurality of memory devices, each memory device including a plurality of memory blocks for storing data, the plurality of memory devices coupled to a channel; and
a memory controller coupled to the channel to be in communication with the plurality of memory devices to provide a read command for instructing a read operation on the plurality of memory blocks to read out data and provide a read enable signal to the memory devices during at least part of an idle time of the channel, which occurs while the read operation is being performed, wherein the plurality of memory devices output first data to the memory controller through the channel in response to the read enable signal, wherein the first data is different from the data previously read out by the read operation that provides the read enable signal in response to the read command, and wherein the plurality of memory devices output, as the first data, status information having a logic value reversed whenever the status information is periodically output.

2. The storage device of claim 1, wherein the memory controller is configured so that the idle time includes a time period from a point in time when the read command is provided through the channel to a point in time when the data is output through the channel, and includes a time period from a point in time when a data output command instructing the memory devices to output the data is provided to the plurality of memory devices to a point in time when the data is output.

3. The storage device of claim 1, wherein the memory controller includes:
a read operation controller configured to control the plurality of memory devices to perform the read operation in response to a read request of a host;
an idle time detector configured to detect the idle time; and
an enable signal controller configured to generate the read enable signal during the idle time, and provide the read enable signal to the plurality of memory devices.

4. The storage device of claim 3, wherein the enable signal controller activates a chip enable signal for selecting the plurality of memory devices according to the read request, and
wherein the read operation controller provides the read command to the plurality of memory devices selected by the chip enable signal.

5. The storage device of claim 3, wherein the enable signal controller periodically provides the read enable signal to the plurality of memory devices during the idle time.

6. The storage device of claim 5, wherein the enable signal controller decreases a toggling period of the read enable signal as the idle time elapses.

7. The storage device of claim 5, wherein the plurality of memory devices periodically output the first data in response to the periodically provided read enable signal.

8. The storage device of claim 3, wherein the memory controller further includes a dummy toggle determiner configured to determine whether to generate the read enable signal by comparing the idle time with a predetermined threshold value.

9. The storage device of claim 8, wherein, in a case that the idle time exceeds the predetermined threshold value, the dummy toggle determiner controls the enable signal controller to provide the read enable signal to the plurality of memory devices.

10. A method for operating a storage device that includes a plurality of memory devices coupled to a channel and a memory controller for controlling the plurality of memory devices through the channel, the method comprising:
providing the plurality of memory devices with a read command corresponding to a read request of a host in response to the read request;
detecting an idle time of the channel, which occurs while a read operation corresponding to the read command is being performed;
providing a read enable signal to the plurality of memory devices during the idle time; and
outputting first data through the channel in response to the read enable signal,
wherein the outputting of the first data comprises outputting status information having a logic value reversed whenever the status information is periodically output as the first data.

11. The method of claim 10, wherein the idle time represents a time from after the read command is provided through the channel to a time at which read data is output through the channel, and includes a time from after a data output command instructing the memory devices to output the data is provided to the plurality of memory devices to the time at which the data is output.

12. The method of claim 10, further comprising activating a chip enable signal for selecting the plurality of memory devices based on the read request.

13. The method of claim 12, wherein the providing of the read command comprises providing the read command to the plurality of memory devices selected by the chip enable signal.

14. The method of claim 10, wherein the providing of the read enable signal comprises periodically providing the read enable signal to the plurality of memory devices during the idle time.

15. The method of claim 14, wherein the providing of the read enable signal comprises decreasing a toggling period of the read enable signal as the idle time elapses.

16. The method of claim 14, wherein the outputting of the first data comprises periodically outputting the first data in response to the periodically provided read enable signal.

17. The method of claim 10, further comprising determining whether to generate the read enable signal by comparing the idle time with a predetermined threshold value.

18. The method of claim 17, wherein the providing of the read enable signal comprises providing the read enable signal in a case that the idle time exceeds the predetermined threshold value.

* * * * *